US012635575B2

(12) United States Patent
Devaux

(10) Patent No.: US 12,635,575 B2
(45) Date of Patent: May 19, 2026

(54) SEMICONDUCTOR DEVICE COMPRISING A STACK OF CHIPS, AND CHIPS FOR SUCH A STACK

(71) Applicant: QUALCOMM Technologies, Inc., San Diego, CA (US)

(72) Inventor: Fabrice Devaux, Lausanne (CH)

(73) Assignee: Qualcomm Incorporated, San Diego, CA (US)

( * ) Notice: Subject to any disclaimer, the term of this patent is extended or adjusted under 35 U.S.C. 154(b) by 407 days.

(21) Appl. No.: 18/031,592

(22) PCT Filed: Oct. 12, 2021

(86) PCT No.: PCT/FR2021/051766
§ 371 (c)(1),
(2) Date: Apr. 12, 2023

(87) PCT Pub. No.: WO2022/079381
PCT Pub. Date: Apr. 21, 2022

(65) Prior Publication Data
US 2023/0260968 A1 Aug. 17, 2023

(30) Foreign Application Priority Data
Oct. 16, 2020 (FR) ...................................... 2010657

(51) Int. Cl.
*H01L 23/34* (2006.01)
*H01L 23/44* (2006.01)
(Continued)

(52) U.S. Cl.
CPC ............ *H10W 90/00* (2026.01); *H10B 80/00* (2023.02); *H10W 20/42* (2026.01);
(Continued)

(58) Field of Classification Search
None
See application file for complete search history.

(56) References Cited

U.S. PATENT DOCUMENTS

| | | | |
|---|---|---|---|
| 8,238,134 B2 | 8/2012 | Matsui | |
| 9,220,183 B1 | 12/2015 | Buvid | |

(Continued)

FOREIGN PATENT DOCUMENTS

| | | |
|---|---|---|
| CN | 111128976 A | 5/2020 |
| WO | 2014167867 A1 | 10/2014 |

(Continued)

OTHER PUBLICATIONS

International Search Report for PCT/FR2021/051766, Mar. 9, 2022, 3 pages.

(Continued)

*Primary Examiner* — Kretelia Graham
*Assistant Examiner* — William Henry Anderson
(74) *Attorney, Agent, or Firm* — Withrow & Terranova, PLLC

(57) ABSTRACT

The invention relates to a semiconductor device (1) comprising a stack of chips (C1; C) arranged in successive levels along a stacking direction, each chip extending in a main plane perpendicular to the stacking direction. The stack (E) comprises a plurality of chips (C1) of a first type comprising a first portion (P1) and a second portion (P2) each extending in the main plane, the first portion (P1) being liable to release more heat than the second portion (P2) when the chip is operating. Each chip of the first type (C1) is arranged in mechanical contact with a chip in an adjacent level of the stack (E) by way of a stacking surface that extends only over its second portion (P2), such that its first portion (P1) forms a projecting part able to be exposed to a cooling fluid.

14 Claims, 7 Drawing Sheets

(51) Int. Cl.

| | |
|---|---|
| *H01L 23/46* | (2006.01) |
| *H01L 23/522* | (2006.01) |
| *H01L 23/528* | (2006.01) |
| *H01L 25/065* | (2023.01) |
| *H10B 80/00* | (2023.01) |
| *H10W 20/41* | (2026.01) |
| *H10W 20/42* | (2026.01) |
| *H10W 40/00* | (2026.01) |
| *H10W 70/63* | (2026.01) |
| *H10W 90/00* | (2026.01) |
| *H10W 40/30* | (2026.01) |
| *H10W 40/40* | (2026.01) |
| *H10W 90/20* | (2026.01) |
| *H10W 90/24* | (2026.01) |

(52) U.S. Cl.
CPC ......... *H10W 20/435* (2026.01); *H10W 40/00* (2026.01); *H10W 70/635* (2026.01); *H10W 90/701* (2026.01); *H10W 40/30* (2026.01); *H10W 40/40* (2026.01); *H10W 90/24* (2026.01); *H10W 90/288* (2026.01); *H10W 90/297* (2026.01)

(56) References Cited

U.S. PATENT DOCUMENTS

| | | | |
|---|---|---|---|
| 9,269,646 B2 | 2/2016 | Luo | |
| 9,941,253 B1 | 4/2018 | Jung | |

| | | | | |
|---|---|---|---|---|
| 2012/0038057 A1* | 2/2012 | Bartley | ................... | H01L 23/50 |
| | | | | 257/E23.174 |
| 2014/0059325 A1* | 2/2014 | Morimoto | ................. | G05F 5/00 |
| | | | | 712/42 |
| 2016/0020160 A1* | 1/2016 | Buvid | .................. | H01L 23/367 |
| | | | | 257/784 |
| 2019/0198489 A1 | 6/2019 | Kim | | |
| 2019/0244946 A1 | 8/2019 | Kim | | |
| 2019/0312019 A1 | 10/2019 | Pietambaram | | |
| 2019/0326272 A1* | 10/2019 | Wilkerson | ............. | H01L 25/18 |
| 2020/0402888 A1* | 12/2020 | Tsutsui | ................... | H01L 23/44 |
| 2021/0183812 A1* | 6/2021 | Ghosh | .................. | H01L 23/473 |
| 2021/0265273 A1* | 8/2021 | Chang Chien | ...... | H01L 23/3675 |

FOREIGN PATENT DOCUMENTS

| | | | |
|---|---|---|---|
| WO | 2016132052 A1 | 8/2016 | |
| WO | 2017055732 A1 | 4/2017 | |
| WO | 2019132966 A1 | 7/2019 | |

OTHER PUBLICATIONS

International Written Opinion for PCT/FR2021/051766, Mar. 9, 2022, 3 pages.

* cited by examiner

[Fig. 1]
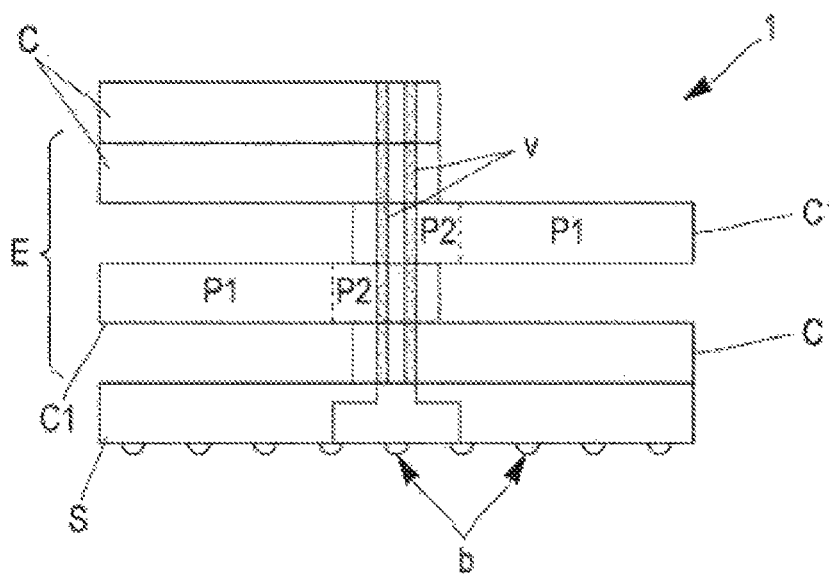
[Fig. 2a]
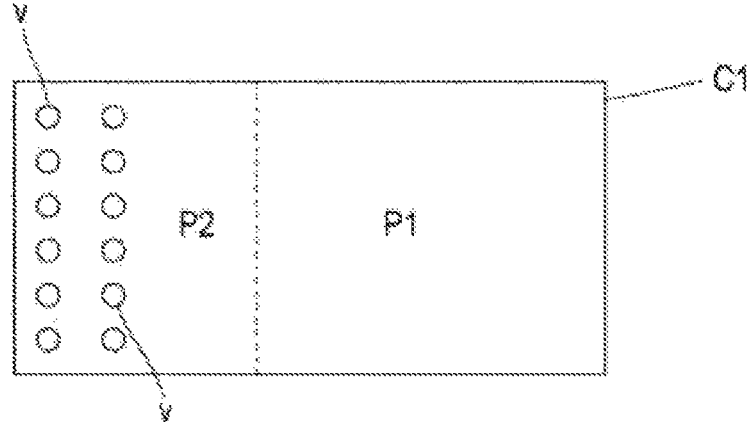
[Fig. 2b]
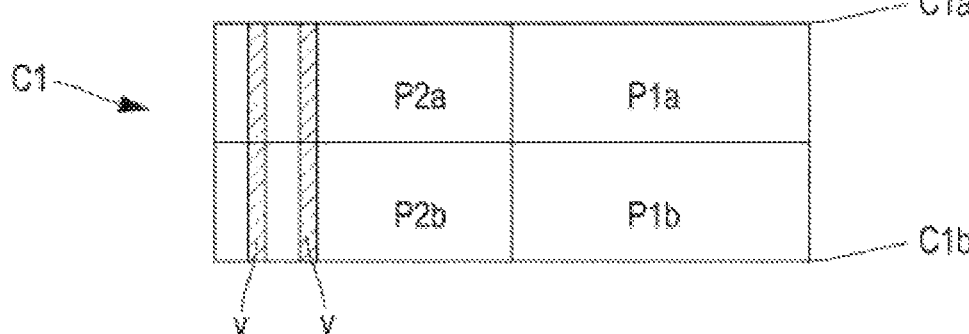

[Fig. 3]
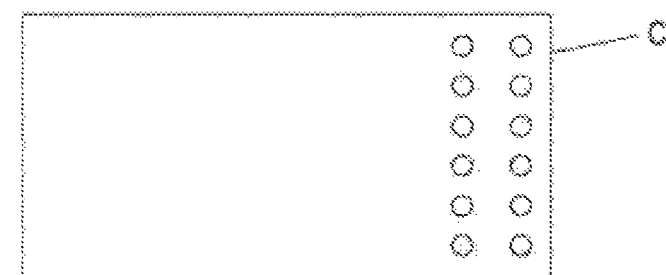
[Fig. 4]
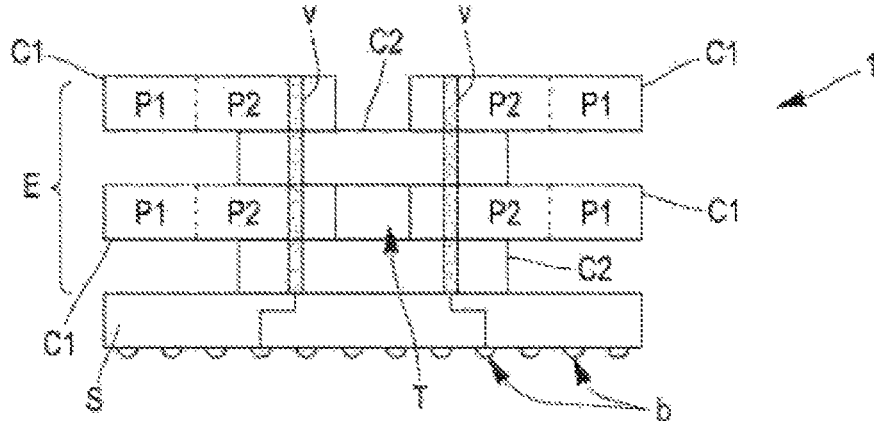
[Fig. 5]
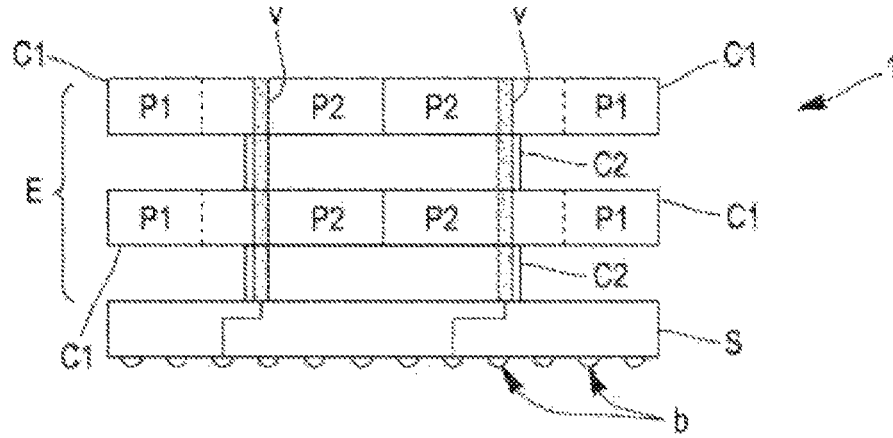

[Fig. 6a]
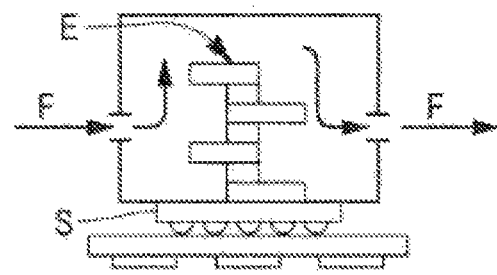
[Fig. 6b]
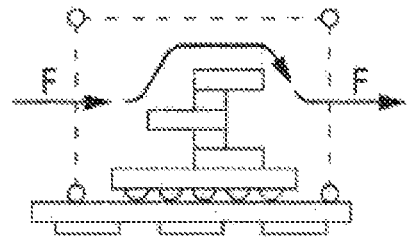
[Fig. 7]
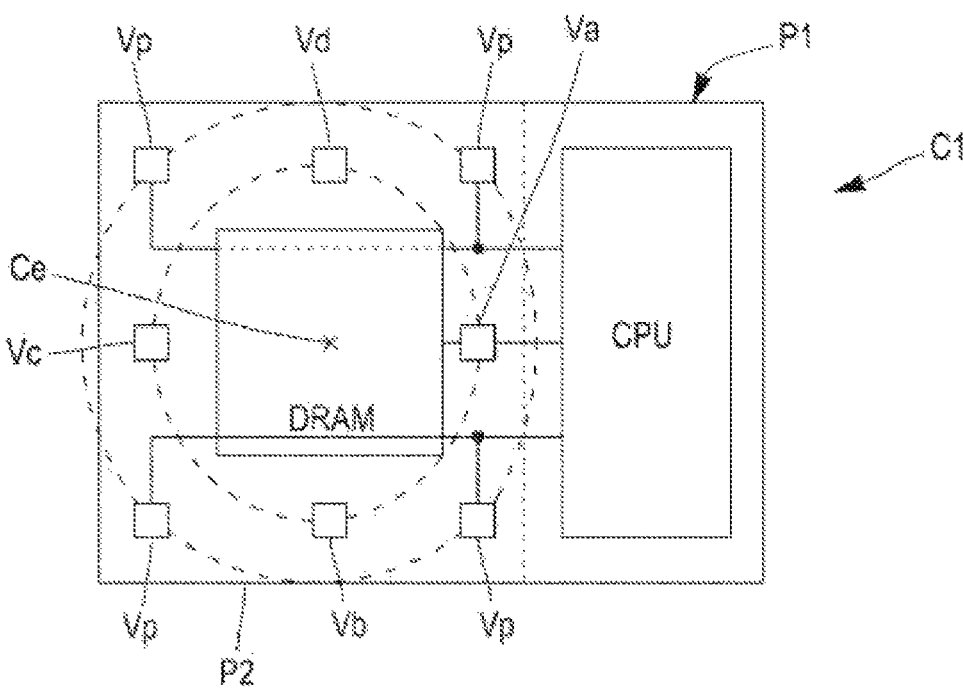

[Fig. 8]
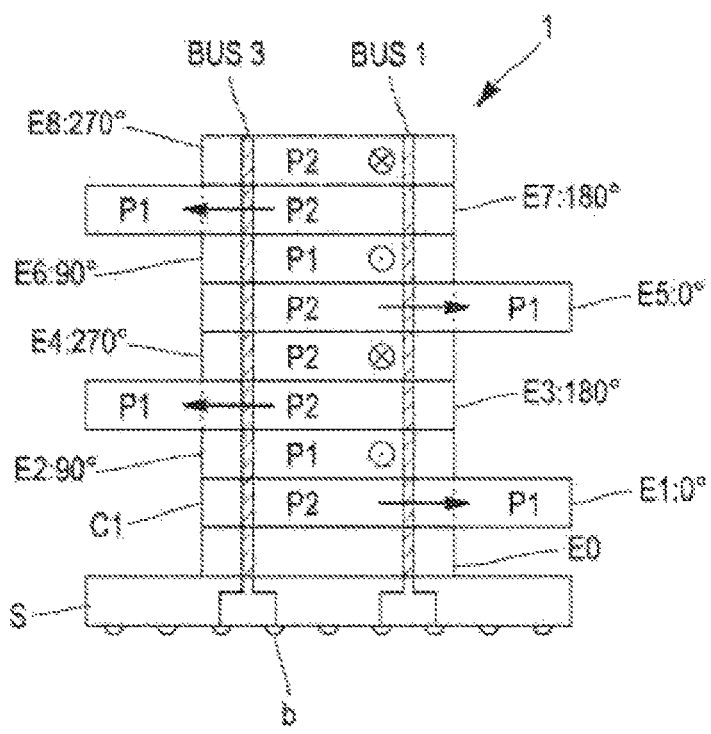
[Fig. 9]
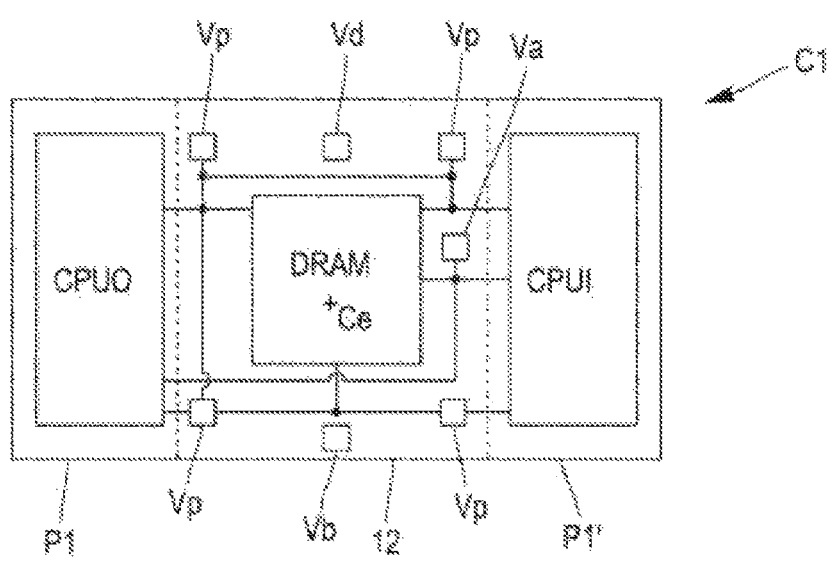

[Fig. 10]
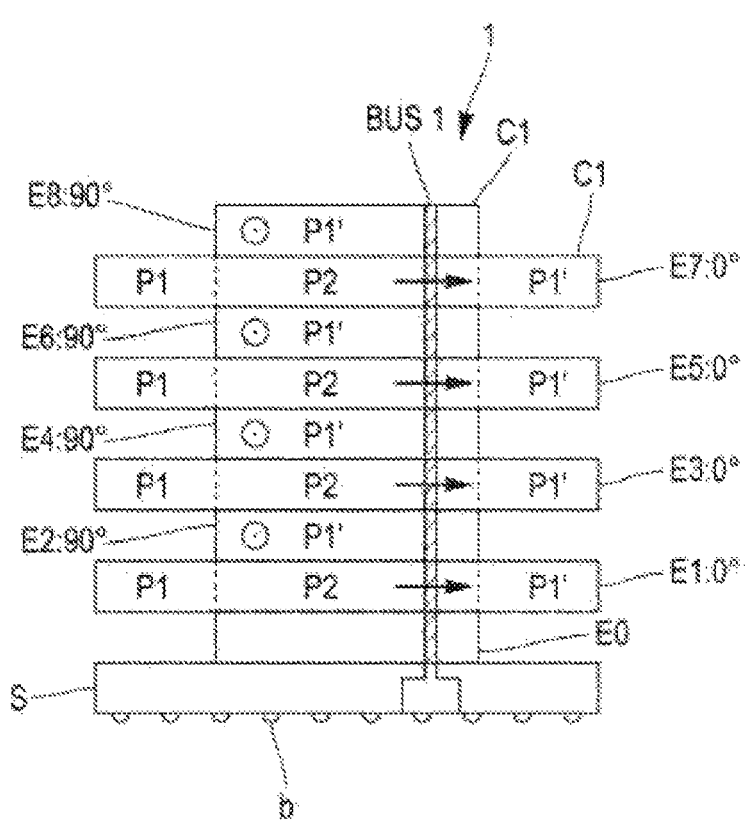
[Fig. 11]
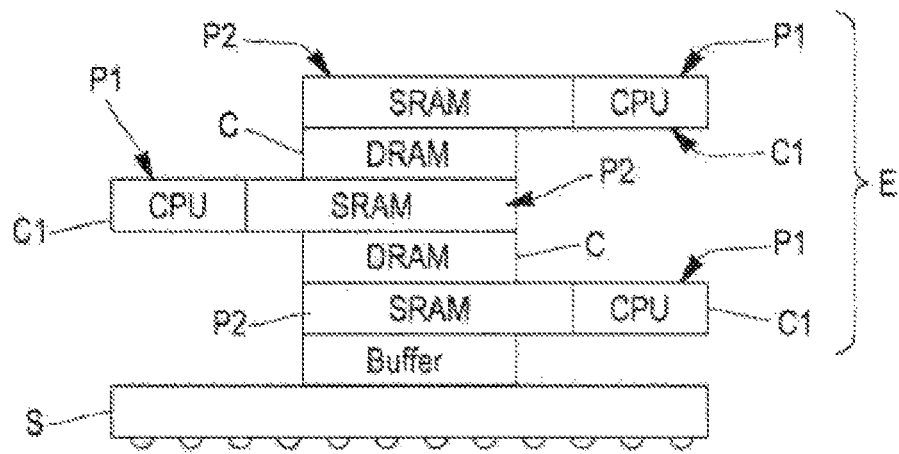

[Fig. 12]
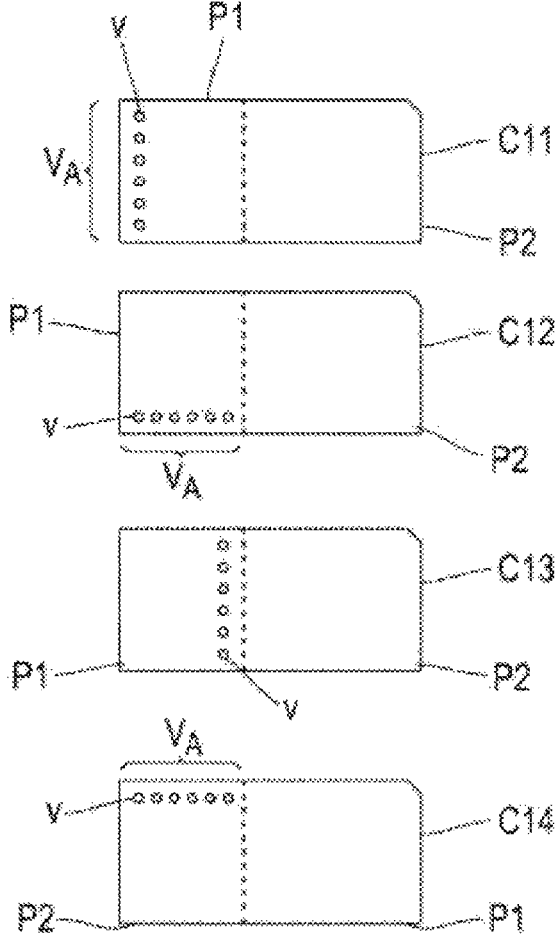
[Fig. 13a]
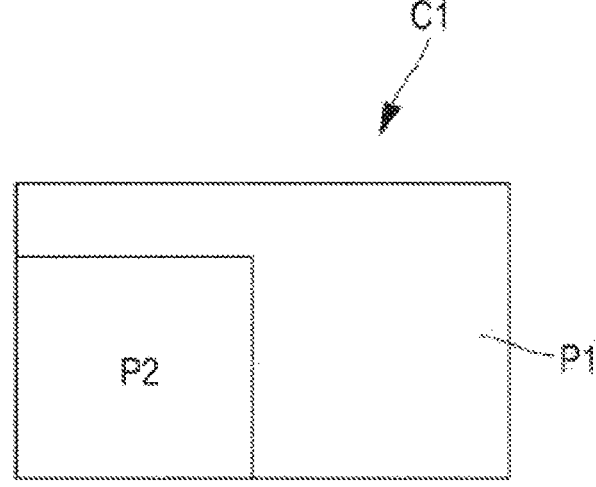

[Fig. 13b]

SEMICONDUCTOR DEVICE COMPRISING A STACK OF CHIPS, AND CHIPS FOR SUCH A STACK

FIELD OF THE INVENTION

The present invention relates to a semiconductor device formed by a stack of chips, the device having improved thermal behavior during its operation.

TECHNOLOGICAL BACKGROUND OF THE INVENTION

Document U.S. Pat. No. 9,269,646 discloses a semiconductor device formed by a vertical stack of chips that are interconnected with one another, this stack aiming to increase the integration density of the device. More specifically, the semiconductor device disclosed in this document comprises a plurality of Dynamic Random Access Memory (DRAM) chips that are precisely arranged on one another and are interconnected by means of through vias. The DRAM chip arranged at the first level of the stack on which the other DRAM chips rest is itself assembled and electrically connected, by its lower face, to a logic chip of the "SOC" (System On a Chip) type. The assembly is retained on an interconnection substrate (called an "interposer") provided with interconnection pins formed by an array of balls ("BGA" or Ball Grid Array), and encapsulated in an electrically insulating material, for example by overmolding a plastic resin.

The logic chip comprises a first portion having a relatively high power density and a second portion having a relatively low power density.

Consequently, the first portion of the chip is capable of releasing more heat than the second. In the solution proposed by the aforementioned document, the stack of DRAM chips is arranged in contact with the second portion of the logic chip, so that the relatively significant heat generated by the first portion can be evacuated without being transmitted to the stack. The heating of the DRAM chips is thus limited, this heating possibly degrading their performance, or even affecting their correct operation.

However, this solution has limitations. The integration density of the device is limited, since it can only provide a single logic chip. In addition, the presence of the encapsulant limits the possible evacuation of the heat that is released from the chips of the device.

OBJECT OF THE INVENTION

The present invention aims to address this problem, at least in part.

BRIEF DESCRIPTION OF THE INVENTION

In order to achieve this aim, the object of the invention proposes a semiconductor device comprising a stack of chips arranged in successive levels along a stacking direction, each chip extending in a main plane perpendicular to the stacking direction, the stack comprising a plurality of chips of a first type comprising a first portion and a second portion each extending in the main plane, the first portion releasing more heat than the second portion when the chip is operating.

According to the invention, each chip of the first type is arranged in mechanical contact with a chip in an adjacent level of the stack by way of a stacking surface that extends only over its second portion, such that its first portion forms a projecting part able to be exposed to a cooling fluid.

According to other advantageous non-limiting features of the invention, taken alone or according to any technically feasible combination:

- the semiconductor device comprises an interconnection substrate, the substrate having a first face on which the stack is arranged and a second face, opposite the first, provided with connection pins;
- the chips of the stack are provided with through vias, the vias of a chip being in electrical contact with the vias of the chips arranged in adjacent levels, the stack of vias forming electrical lines of a bus;
- the stack comprises a buffer chip comprising buffer circuits respectively associated with the electrical lines of the bus;
- the stack is arranged in the housing of a protective element;
- a level of the stack comprises at least two chips.
- the chips have an active face and a passive face opposite the active face, two chips arranged in adjacent levels of the stack being assembled by their passive faces or by their active faces;
- the stack is made up of chips of the first type, the first portion of the chips comprising a first circuit and the second portion of the chips comprising a second circuit, different from the first circuit;
- the first circuit is a processor and the second circuit is a memory array;
- each chip of the stack comprises, in its second portion:
  - a plurality of groups of feed-through vias connected to the first and the second circuit and arranged on a first circle;
  - a plurality of groups of logic signal through vias arranged along a second circle having the same center as the first circle, one group of logic signal through vias being connected to the first circuit and to the second circuit and the other groups of through vias not being connected to the first circuit and to the second circuit;
- two chips arranged in adjacent levels of the stack are angularly offset by an angle chosen from the list formed by 90°, 180° and 270°.

According to another aspect, the object of the invention relates to a semiconductor chip extending along a main plane in which there extends a first portion comprising a first circuit and a second portion comprising a second circuit, the first portion releasing more heat than the second portion when the chip is operating.

According to the invention, the second portion also comprises:

- a plurality of groups of feed-through vias connected to the first and to the second circuit and arranged at a constant angular pitch on a first circle.
- a plurality of groups of logic signal through vias arranged along a second circle having the same center as the first circle, one group of logic signal through vias being connected to the first circuit and to the second circuit and the other groups of through vias not being connected to the first circuit or to the second circuit.

According to other advantageous non-limiting features of this aspect of the invention, taken alone or according to any technically feasible combination:

- the first circle and the second circle have different radii;
- the first circuit is a processor and the second circuit is a memory array;

the semiconductor chip comprising at least one temperature sensor.

BRIEF DESCRIPTION OF THE DRAWINGS

Other features and advantages of the invention will emerge from the following detailed description of the invention with reference to the appended figures, in which:

FIG. 1 shows a semiconductor device according to a first embodiment;

FIG. 2a shows a top view of a chip according to a first type of chip of the first embodiment;

FIG. 2b shows a sectional view of another chip according to a first type of chip of the first embodiment;

FIG. 3 shows a top view of a chip according to a second type of chip of the first embodiment;

FIGS. 4 and 5 respectively show a semiconductor device according to variants of the first embodiment;

FIGS. 6a and 6b show two examples of a semiconductor device comprising an element for protecting the stack of chips;

FIGS. 7 and 9 show a top view of chips of a first type of chips according to another embodiment;

FIGS. 8 and 10 show semiconductor devices according to another embodiment;

FIGS. 11 and 12 show semiconductor devices according to a variant of the other embodiment;

FIGS. 13a and 13b respectively show chips of the first type and a configuration for stacking these chips, in a configuration according to the present invention.

DETAILED DESCRIPTION OF THE INVENTION

FIG. 1 shows a semiconductor device 1 according to a first embodiment and illustrates the general principles implemented by a semiconductor device 1 according to the invention.

The semiconductor device 1 comprises a stack E of chips C, C1 arranged in successive levels along a stacking direction. As is entirely conventional and known, the chips C, C1 are functional semiconductor elements generally extending in a main plane. A chip generally has an active face (corresponding to the surface on which microelectronic components have been etched) and a passive face, opposite the active face.

In the stack E of FIG. 1, the chips are arranged on top of one another, the main plane of the chips being perpendicular to the stacking direction. The chips C, C1 typically have, in the main plane, a length and a width of between 5,000 microns and 15,000 microns. Their thickness is typically between 30 microns and 75 microns. In the general context of FIG. 1, the chips C, C1 can be of different types (of the first or of the second type, as will be presented in the subsequent sections of this description) and the chips of the same type can be different from one another, i.e. they can implement functions and/or have geometries that are different from one another. A stack comprising chips of different types is said to be "heterogeneous."

Thus, a first type of chip, shown in top view in FIG. 2a, is made up of chips C1 comprising a first portion P1 that is capable of releasing more heat than a second portion P2 of the chip C1, when the chip C1 is in operation. A chip C1 of the first type may comprise several separate first portions P1. The heat produced by the first portion(s) P1 of such a chip C1, if it was transferred for example by conduction to the other chips of the stack E, would likely affect the proper operation of the semiconductor device 1. This is in particular true when a plurality of chips C1 of the first type are included in the stack E, or even when all the chips of the stack E are chips C1 of the first type.

The chips C1 of the first type are typically so-called "logic" chips, and the first portion P1 of the chip is composed of microelectronic circuits having a power density that is relatively greater than the power density of the microelectronic circuits of the second portion P2. By way of example, the first portion P1 may comprise microelectronic circuits implementing a microprocessor, while the second portion P2 may be made up of memory and/or interconnections.

It should be noted that the chips C1 of the first type may themselves be made up of an assembly of two elementary chips, and therefore result from the so-called "3D" integration of these two chips. As is well known per se, this integration can be carried out at the wafers of elementary chips, before singulating the chip C1 of the first type ("wafer level 3D integration") or at the elementary chips themselves, after singulation thereof ("die to die 3D integration", or in a mixed integration ("die to wafer 3D integration"). Such an assembly of elementary chips, forming a chip C1 of the first type, is thus shown in FIG. 2b. Each elementary chip C1a, C1b has a first portion P1a, P1b that is capable of releasing more heat than a second portion P2a, P2b, when the chip C1 is operating. The two elementary chips C1a, C1b are assembled, for example by molecular adhesion, by their active faces so as to place the first portions P1a, P1b facing one another and the second portions P2a, P2b facing one another.

Thus, in the chip C1 of the first type formed by such an assembly, there is a first portion P1 composed of the first portions P1a, P1b of each elementary chip C1a, C1b, and a second portion P2 composed of the second portions P2a, P2b of these elementary chips. It should be noted that the thickness of a chip of the first type C1 formed by assembly can be relatively greater than the thickness of a chip C1 of the first type that is not formed by assembly. This thickness may in particular be doubled, typically between 60 and 150 microns to take up the typical thicknesses given above.

Continuing the description of FIG. 2, a chip C1 of the first type is provided with a plurality of conductive and through vias v, arranged in the second portion P2, for example at the periphery of the functional circuit incorporated in this second portion. The vias extend into the thickness of the chip C1, from one face of this chip C1 to the other. They are connected, for some of them at least, to the microelectronic circuits of the first portion P1 and of the second portion P2, so as to electrically supply them and to conduct the electrical signals allowing the implementation of the functionalities of these circuits.

A chip C of a second type of chip, distinct from the first type of chip, is shown in FIG. 3. The chips C of the second type are not liable to release excessive heat themselves that may affect their correct operation. To a certain extent, the chips C of the second type can be stacked on one another without particular precautions. These chips C may nevertheless be heat sensitive, and their performance or their operation may be affected by an excessive temperature, exceeding a determined threshold temperature.

Like the chips C1 of the first type, a chip C of the second type also has a plurality of conductive and through vias. The arrangements of the vias on the chips C1 of the first type and on the chips C of the second type are compatible with one another, so that it is possible to electrically contact the vias of two chips, whether these chips are of the first type or of the second type, when they are arranged in contact with one another in adjacent levels of the stack E.

Returning to the description of the semiconductor device of FIG. 1, the latter therefore comprises a stack E formed of at least one plurality of chips C1 of the first type (and chips C of the second type). Each of these chips C1 of the first type is arranged in mechanical contact with a chip C, C1 of an adjacent level of the stack, the vias of the two chips C, C1 being in electrical contact. The mechanical contact between the two chips C, C1 is produced at a stacking surface extending over (or in line with) the second portion P2 only. In other words, the stacking surface of a chip C1 of the first type, that is to say, the surface of the chip C1 in mechanical contact with the chip(s) C, C1 of the adjacent levels, does not extend to the first portion P1 of the chip C1.

In this way, the first portion P1 of the chips C1 of the first type projects from the stack E, these projecting parts in a way forming cooling fins that can be exposed to a fluid. It is thus possible to very effectively evacuate the heat given off by the first portions P1 of these chips, this heat being relatively significant. Furthermore, the evacuated heat is not communicated directly to the other chips of the stack E.

In order to promote the flow of the fluid on the exposed surfaces of the chips (whether these chips are of the first or second type), it is possible to envisage treating their surfaces (and preferably the one extending at the first portion P1 or, more generally, extending outside the stacking surface, chemically and/or mechanically to facilitate the flow of the fluid and the transmission of heat. It may for example be a question of forming grooves on the exposed surface of the chips of the first type, at least at their first portion. Treating the stacking surfaces of the chips will be avoided if these treatments are liable to weaken the mechanical bond between the chips of the stack E.

The semiconductor device 1 also comprises an interconnection substrate S on a first face of which the stack E is arranged. On its second face, opposite the first face, connection pins b are provided, which may be of all types, for example a ball array of the BGA type. The connection pins b are connected to the stack E arranged on the first face of the interconnection substrate S by electrical tracks internal to the substrate, as is usual in the cases of complex electronic circuits.

In the example of FIG. 1, it is noted that two chips C of the second type can be stacked on one another without particular precautions. Conversely, the two chips C1 of the first type are each arranged in the stack so that their first portion P1 is projecting. Their stacking surfaces in contact with the chips of the adjacent levels do not extend beyond the second portion P2.

As is clearly visible in FIG. 1, the semiconductor device 1 thus formed has micrometric recesses, which generally correspond to the thickness of a chip C, C1 of the first or of the second type depending on the organization of the stack E. These recesses may be traversed by a cooling fluid. Its thermal behavior is thus improved. It should be noted that when such a recess is formed by a chip of the first type C1 made up of the assembly of two elementary chips as has been presented with reference to FIG. 2a, this recess may have a relatively larger height, which can promote the flow of the fluid and the evacuation of heat.

To allow this arrangement having projecting chips, some chips of the stack E may be angularly offset (in a plane perpendicular to the stacking direction) with respect to the chips of the adjacent levels. This angular offset can be obtained by rotating these chips about an axis parallel to the stacking direction, passing through a point located in their second portion P2. This angular offset between a chip C1 of the first type and the chips arranged in the adjacent levels is 180° in the stack of FIG. 1, but an offset of 90° or 270° could be provided for at least some of the chips C1 of the first type in the stack E, with respect to the chips of the adjacent levels. These offset angles also make it possible to make the first portion of the chips C1 of the first type in the stack E. Angularly offsetting the chips of successive adjacent levels by 90° is advantageous, since in this case two chips oriented in the same direction are separated by three levels of chips, which increases the distance separating the projecting parts of these two levels accordingly, which promotes the flow of the fluid in this micrometric recess.

Of course, any other arrangement of the chips in the stack E may be envisaged insofar as the first portion P1 of the chips C1 according to the first type forms a projecting part of the stack E that can be exposed to a cooling fluid.

It is in particular possible to provide that a first chip and a second chip respectively arranged in adjacent levels of the stack E are assembled by placing the active face of the first chip in contact with the passive face of the second chip, but any other "turned-over" assembly configuration can also be envisaged. Thus, the active faces of the first and of the second chip can be assembled together or, alternatively, the passive faces of the first and of the second chip can be assembled together.

In the general context of FIG. 1, the arrangement of the vias on each chip C, C1 of the stack E has been pre-established such that vias in contact in the stack carry the same electrical signal. This continuity of electrical contact between the vias of each chip leads to defining a bus of the semiconductor device 1 that extends vertically in the stack E, perpendicularly to the main planes of the chips. This bus is formed by electrical lines made up of the stack of the vias of each of the chips C, C1 of the stack E.

When the number of chips is relatively large, the bus can have a high electrical load, and in this case it will be possible to provide a buffer chip in the stack E, for example arranged in a first level of the stack directly on the interconnection substrate. The buffer chip can have buffer circuits that are respectively associated with the electrical lines forming the bus and that make it possible to amplify the power supplies and the signals passing through them such that they are correctly transmitted to the chips of the stack. The buffer chip can also make it possible to connect certain lines of the bus to one another, for example to duplicate an electrical signal on two separate lines.

FIGS. 4 and 5 show alternative embodiments of the first embodiment. In these variants, certain levels have several chips. In the variant of FIG. 4, two chips C1 of the first type arranged in the same level are laterally separated from one another, so that a central recess T is defined, forming a sort of tunnel passing through the semiconductor device 1, which makes it possible to circulate the fluid centrally in this device 1 and to very efficiently evacuate the heat emitted during its operation.

In the example of FIG. 5, the two chips C1 of the first type arranged in the same level are laterally in contact with one another, and consequently the device 1 does not have this central recess.

Figure 13B:
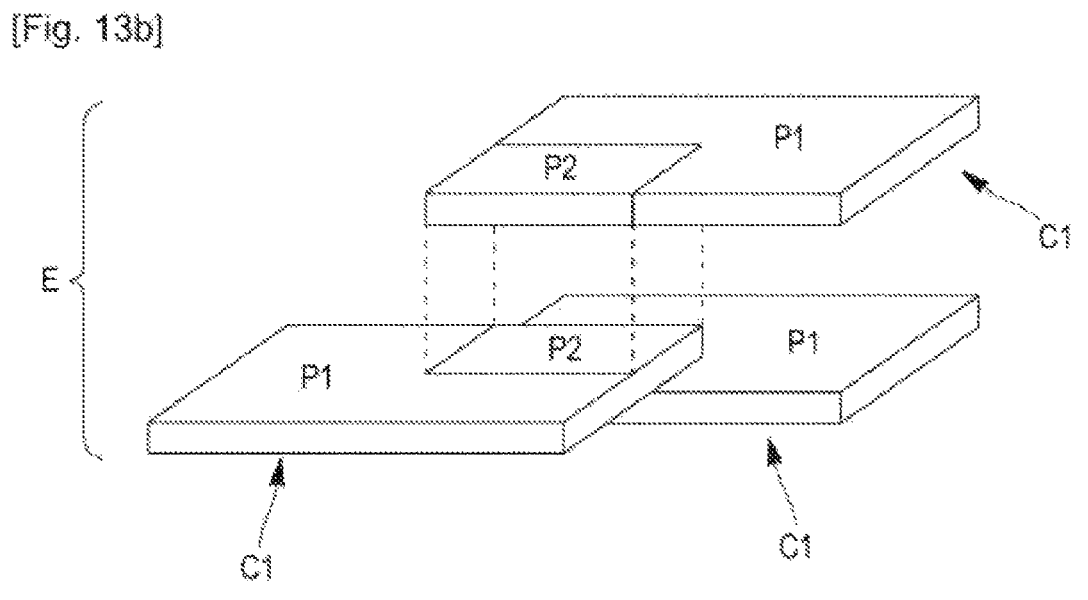

FIGS. 13a and 13b respectively show a chip C1 of the first type and a stack configuration E of a plurality of such chips, in a configuration according to the present invention.

The chips C1 of FIG. 13a are of general rectangular shape. The portion P2, which releases relatively little heat, also has a rectangular (and advantageously square) shape whose dimensions are smaller than those of the chip C1. It is arranged in one of the corners of the chip C1 of the first type, such that the first portion P1, which releases relatively more heat, can be arranged in at least one of the two lateral strips of the chip C1 that are not occupied by the second portion P2.

In the stack E shown in FIG. 13b, a plurality of chips of the first type C1, all according to the configuration shown in FIG. 13a, are assembled together by placing them in mechanical contact by a stacking surface that extends only over the second portion P2 of the chips.

FIG. 11 shows an example of a particularly interesting application of a heterogeneous stack E. This stack is arranged on an interconnection substrate S on which a buffer chip is supported, designated "buffer" in the figure. The rest of the stack E incorporates chips C1 of the first type that have a first portion P1 comprising a circuit consisting of a CPU processor. The chips C1 of the first type also have a second portion P2 comprising a static memory circuit SRAM. The static memory circuit SRAM is generally less dense (in comparison with a dynamic memory circuit DRAM), but very fast, and in any case releases a much smaller amount of heat than the portion P1 comprising the circuit constituted by the CPU processor, when the chip is operating. The heterogeneous stack E also comprises chips C of the second type, formed in the example by chips comprising dynamic memory circuits DRAM. As is clearly visible in FIG. 11, the stacking surfaces of the chips C1 of the first type do not extend beyond the second portion P2 comprising the static memory circuit SRAM. The first portions P1 of the chips C1 of the first type project from the stack E.

As an alternative to the stacking configuration shown in FIG. 11 in which the first portion P1 of the chips C1 of the first type is arranged laterally to the second portion P2, provision may be made for the first portion P1 to form a ring peripheral to the second portion P2, thus arranged centrally. The chips C of the second type of the stack E are chosen to have dimensions such that these chips can fit in the contour of the second central portion P2. The stack then creates contact, in two successive levels, between an entire face of this chip of the second type C and at least part of the second central portion P2 of a chip C1 of the first type. However, the contact face of the chip of the second type C does not contact the first portion P1 of this chip. In this way, the first peripheral portion P1 of each chip C1 of the first type of the stack indeed projects, over its entire extent, from the stack.

It should be noted that in the configuration of FIG. 11 and in the above alternative configuration, it is not necessary to angularly offset the chips C, C1 arranged in successive levels relative to one another.

Of course, the stack E can be entirely encapsulated using an electrically insulating material, as is the case in the solution presented in the prior art. This encapsulating material would no longer make it possible to circulate the fluid against the projecting parts of the stack E. In order to nevertheless provide mechanical protection to the stack E of chips, it is possible to provide for it to be arranged in the housing of a package (FIG. 6a) or a frame (FIG. 6b), these protective elements making it possible to make the fluid circulate against the projecting parts in order to evacuate the heat that is released therefrom. In the case of the package of FIG. 6a, the latter can be carried by the interconnection substrate S. It defines a volume surrounding the stack E, this volume being filled with the cooling fluid. The package may be provided with openings allowing the fluid F to be circulated. In the example of FIG. 6b, the stack E is arranged via the interconnection substrate S at a support, for example a printed circuit support, and the stack is protected by a protective frame, for example metal. This frame forms a cage having a surface that is sufficiently open to allow the flow of a fluid F against the exposed surfaces of the stack.

The fluid may be of any suitable nature, a gas or a liquid. If it is air taken from the environment, care will be taken to filter this air in order to eliminate a maximum of particles or dust, which could seal the micrometric recesses of the stack E. Generally, the fluid must be free of such particles.

With reference to FIGS. 7 and 8, a preferred and particularly advantageous embodiment in which all the chips of the stack E, or at least a very large majority of them, are of the same first type is described below. It is possible to provide, in the stack, in addition to the chips C1 of the first type, at least one buffer chip as has been presented in an earlier paragraph. The chips C1 of the first type that substantially make up the stack E may furthermore have all the same dimensions and the same arrangement of through vias, which facilitates the manufacture in volume thereof. Each chip C1 of the stack therefore comprises at least one first portion P1 capable of releasing more heat than a second portion P2 of the chips C1.

As already indicated, the first portion may comprise or be made up of a CPU processor and the second portion may comprise or be made up of a dynamic memory circuit DRAM. In this configuration, the chip C1 may be referred to as a "Processing In Memory" or PIM chip. Examples of such chips may in particular be found in documents EP3259674 or EP3356945 in the name of the company UPMEM.

The embodiment that will be presented allows a highly integrated semiconductor device 1 to be formed that is substantially made up of a stack E of such PIM chips. The heat that results from the operation of the CPU processors (relatively high) can be effectively evacuated, so that it does not raise the temperature of the device 1 beyond a temperature threshold for which the operation of the memory circuits DRAM is likely to degrade. Typically, this threshold temperature is of the order of 95° C., a temperature exceeding 85° C. already requiring doubling the frequency of the periodic refreshes of the memory DRAM.

FIG. 7 shows a chip C1 constituting the stack E of a semiconductor device 1 that is compatible with this embodiment. On the chip of this figure, there is a first portion P1, here comprising a CPU processor, capable of releasing a relatively large amount of heat, and a second portion P2, here comprising a dynamic memory circuit DRAM, capable of releasing a smaller amount of heat.

The second portion P2 of the chip C1 is such that the chips can be arranged on top of one another in the stack E by coming into contact respectively at a stacking surface that is square, the symmetry of this stacking surface making it possible to offset the chips angularly relative to one another by an angle of 0°, 90°, 180° and/or 270°. A rectangular stacking surface could make it possible to offset the chips angularly relative to one another by an angle of 0° and 180°. This surface extends at the entire second portion P2 of the chip in the example shown, but it could be otherwise. However, in all cases, the stacking surface does not extend into the first portion P1 of the chip C1.

The chip C1 of FIG. 7 also comprises 8 groups of through vias referenced Va, Vb, Vc, Vd and Vp in the figure (represented by squares for visibility reasons), the notation Vp collectively designating 4 groups of power vias serving to convey the electrical power supply of the chips. The groups of vias Va, Vb, Vc and Vp are collectively referenced V in the remainder of this description. Each group of vias comprises a plurality of independent vias, the vias of the via group Va collectively transporting the signals allowing the operation of the chip C1. The signals respectively carried by the groups of vias called "logic" vias Va, Vb, Vc and Vd are identical to one another, and the signals carried by the 4 groups of vias called "power" vias Vp are also identical to one another. The groups of vias emerge on the main faces on either side of the chip at the stacking surface, so that the groups of vias V of a chip can contact the groups of vias V of another chip arranged in an adjacent level of the stack E.

Among the groups of vias V, the 4 groups of power vias Vp are spaced at a constant pitch of 90° on a circle (shown in dotted lines in FIG. 7), whose center Ce here is arranged at the center of the square of the stacking surface (corresponding in the example shown to the second portion P2 of the chip C2). These groups of power vias Vp are advantageously all connected to the active elements of the chip C1, dynamic memory circuit DRAM and CPU processor to power them electrically. When two chips C1 are stacked on top of one another by angularly offsetting them by 90°, 180° or 270° by rotation of one of the two chips relative to the other about an axis parallel to the stacking direction passing through the center Ce, the groups of power vias Vp of the chips are in electrical contact with one another. More precisely, each via of a group of power vias Vp of one of the two chips C1 is in contact with a via intended to carry the same signal of a group of power vias Vp of the other chip C1. It could naturally be provided that the groups of power vias Vp are not all connected to one another in order to distribute the power to the chips of the stack by means of a plurality of power buses, which are distinct from one another, as a non-limiting example, conveying different voltages.

The four groups of logic vias Va, Vb, Vc, Vd are also arranged at a constant angular pitch of 90° on a circle (also shown in dashed lines in FIG. 7) having the same center Ce, but possibly having a radius different from the circle on which the power vias Vp are distributed. The vias of a first group of logic vias Va are electrically connected to the functional elements of the chip, the dynamic memory circuit DRAM and the CPU processor. The electrical signals carried by the vias of the first logic group Va therefore make it possible to make these circuits of the chip functional. The other groups of logic vias Vb, Vc, Vd are not connected to the functional elements and have the function of propagating the electrical signals through the chip C1, from one main face to the other, so as to allow these signals to be transmitted between two chips C1 of the stack E arranged in adjacent levels.

The groups of logic vias Va, Vb, Vc, Vd have the same number of vias and the vias of the logic groups collectively carry the same electrical signals. When two chips C1 are stacked on top of one another by angularly offsetting them by 90°, 180° or 270° by rotation of one of the two chips relative to the other about an axis parallel to the stacking direction passing through the center Ce, the groups of logic vias Va, Vb, Vc, Vd of the chips C1 are in electrical contact with one another. More precisely, each via of a group of logic vias of one of the two chips C1 is in contact with a via intended to carry the same signal of another group of logic vias Va, Vb, Vc, Vd of the other chip C1.

FIG. 8 thus shows an example of a semiconductor device 1 implementing a stack of eight chips C1 all according to those shown in FIG. 7. These chips are arranged on top of one another, in mechanical contact at their respective stacking surface in order to form 8 levels referenced E1 to E8 in FIG. 8. The stack is arranged on the interconnection substrate S, and a buffer chip (which nevertheless remains optional) is provided in the illustrated example directly on the interconnection substrate in an initial level E0 of the stack.

The chip C1 of the first level E1 of the stack is oriented in a direction (embodied by an arrow in the reference figure) defining an orientation of 0°. The chips of the following levels E2-E8 are stacked on the chip of the first level E1, the centers Ce of the stacking surfaces of the chips of these levels all being aligned on the center Ce of the stacking surface of the chip of the first level E1. This alignment defines an axis of rotation of the stack E.

Two chips of successive levels are angularly offset from one another by 90°, 180° or 270°. In the example shown, the chip of a level En is offset by 90° relative to the chip En−1, thus directly underlying.

The configuration in FIG. 8, shows the following interconnection scheme, where each column of this table indicates the groups of logic vias electrically in contact with one another in the chips C1 of the levels E1-E8:

TABLE 1

|     | BUS 1 | BUS 2 | BUS 3 | BUS 4 |
| --- | --- | --- | --- | --- |
| E1 | Va | Vb | Vc | Vd |
| E2 | Vd | Va | Vb | Vc |
| E3 | Vc | Vd | Va | Vb |
| E4 | Vb | Vc | Vd | Va |
| E5 | Va | Vb | Vc | Vd |
| E6 | Vd | Va | Vb | Vc |
| E7 | Vc | Vd | Va | Vb |
| E8 | Vb | Vc | Vd | Va |

This interconnection scheme therefore leads to forming, in the device 1, four buses BUS 1 to BUS 4 (2 buses BUS1, BUS3 being made visible in the diagram of FIG. 8), each bus being formed of the interconnected vias of the groups of logic vias of each chip C1. Each bus comprises the same electrical signals as the other buses, these signals being carried by vias constituting the different groups of vias Va, Vb, Vc, Vd. The buffer chip, when present, can connect the four buses together electrically, so that the same electrical signals propagate vertically in each of the four buses of the device 1. If this chip is not present, the interconnection of the four buses can be carried out by tracks suitably arranged on or in the interconnection substrate S. Connecting these 4 buses together is not necessary for the invention, and is only one embodiment.

The first bus BUS 1 connects the functional circuits CPU, DRAM comprised in the chips of the first level E1 and the fifth level E5, since, as a reminder, only the vias of the first group of vias Va are electrically connected to these functional circuits. The first bus BUS 1 simply passes through the chips of the other levels without being electrically connected to the functional circuits. Similarly, the second bus BUS 2 connects the functional circuits CPU, DRAM comprised in the chips of the second level E2 and the sixth level E6. The third bus BUS 3 connects the functional circuits CPU, DRAM comprised in the chips of the third level E3 and of the seventh level E7. The fourth bus BUS 4 connects the functional circuits CPU, DRAM comprised in the chips of the fourth level E4 and the eighth level E8.

The interconnection structure of the chips C1 therefore implements a plurality of identical buses, that is to say, buses formed by conducting lines bearing the same groups of signals. Each bus is connected to the functional circuits of some of the chips only, but the functional circuits of all the chips are connected to one of the buses. With this interconnection structure, the chips C1 can be stacked freely on top of one another, angularly offsetting two chips arranged on adjacent levels by an angle of 90°, 180° or 270°. The stack shown in FIG. 8 is therefore only given by way of example. Regardless of the chosen angular offset (90°, 180° or 270°) between two chips of adjacent levels of the stack E, a fully functional semiconductor device is available. It is also ensured that the first portions P1 of the chips C1 of the stack E project from this stack, which allows their heat to be evacuated very effectively. This "rotary" stack also has the advantage of increasing the distance between 2 projecting portions P1, allowing a better flow of the cooling fluid.

Depending on the extent and the distribution of the first portion P1 of a chip along its main plane, provision may be made for an arrangement other than the one that has just been presented. As an example, FIG. 9 shows a chip C1 of the first type having a second portion P2 arranged centrally between two first portions P1, P1', therefore arranged laterally relative to second portion P2. The two first portions P1, P1' here comprise two processors CPU0, CPU1, and the second portion P2 comprises a memory circuit DRAM. The chip C1 of FIG. 9 shows four groups of power vias Vp arranged in the same way and having the same properties as the groups of power vias Vp of the example of FIG. 7. However, only two or three of these groups of power vias Vp could be provided. There are three groups of logic vias Va, Vb, Vd arranged as described above, the third group of logic vias Vc being omitted, on a circle of the same center Ce, here at the center of the chip, but possibly having a radius different from the circle on which the power vias Vp are distributed. Only the vias of the first group of logic vias Va are electrically connected to the functional elements of the chip, the dynamic memory circuit DRAM and the processors CPU0, CPU1. The vias of the second and third groups of logic vias Vb, Vd are through vias only, without interconnection with the functional elements.

With the arrangement of the chip C1 shown in FIG. 9, it is possible to produce a stack in which the chips are successively stacked and oriented in the reference direction (0°) and in the 90° direction (clockwise). An interconnection scheme with two buses BUS 1, BUS 2, organized according to the table below, is then obtained when 8 chips are arranged according to 8 levels E1-E8 as is illustrated in FIG. 10.

TABLE 2

|  | BUS 1 | BUS 2 |
| --- | --- | --- |
| E1 | Va | Vb |
| E2 | Vd | Va |
| E3 | Va | Vb |
| E4 | Vd | Va |
| E5 | Va | Vb |
| E6 | Vd | Va |
| E7 | Va | Vb |
| E8 | Vd | Va |

It should be noted that the arrangement of the chip C1 shown in FIG. 9 can also be simplified by providing it only with the first and the fourth group of vias Va, Vd and by using a "turned-over" assembly of some of the chips C1 of the stack E of FIG. 10. According to this approach, the chips arranged in the first and second levels E1, E2 are stacked active face against active face, the chips arranged in the third level 3 and fourth level E4 are stacked passive face against passive face, and so on.

Advantageously, a chip C1 capable of being stacked according to one of the presented embodiments to form a semiconductor device 1 comprises a temperature sensor, for example a thermal diode. Advantageously, a plurality of such sensors can be provided on a chip, for example integrated into the chip near the boundary between the first portion P1 and the second portion P2 of this chip. The temperature sensor can be used to verify the proper cooling of the device 1 by the fluid. The measurements provided by these sensors can also be used to reduce the execution speed of the circuits of the first portion of certain chips, in order to reduce the temperature rise. Or this measurement can even make it possible to regulate the circulation of the fluid, for example its flow rate, to control this temperature rise.

One of the advantages of the embodiment described with reference to FIGS. 7 to 10 is that it advantageously allows stacking of the chips C1 of the first type that are identical to one another. However, the invention is in no way limited to this feature, and it also applies in the case where chips of different types are stacked (as has been presented in the description of FIG. 1). It also applies when the chips of the first type of the stack are not identical to one another, in terms of their functions or their geometries, for example.

FIG. 12 thus shows four chips C11, C12, C13, C14 of the first type that have different configurations. They all have a first portion P1 and a second portion P2, here of square shape, this second portion P2 forming the stacking surface of the chips. Each portion P2 is equipped with vias V collectively defining a group of vias Va. These vias V are connected to the circuits contained in the first portion P1 and in the second portion P2 of the chips. By taking the first chip C11 of FIG. 12 as a reference chip, the second chip C12 is configured to be incorporated into the stack E in a manner offset angularly by 90° (clockwise) relative to the first chip C11. In this configuration, a via V of the second chip C12 is in contact with the vias V carrying the same signal of the adjacent chips in the stack. Similarly, the third chip C13 of FIG. 12 is configured to be incorporated into the stack with an angular offset of 180° (clockwise) with respect to the first chip C11. And the fourth chip C14 is configured to be incorporated into the stack with an angular offset of 270° (clockwise) with respect to the first chip C11. It is thus possible to mix first, second, third and fourth chips in no particular order to form a stack according to this embodiment, insofar as two chips arranged in successive levels are not identical. In other words, stacking two first, second, third or fourth chips in adjacent levels is avoided.

It should be noted that this configuration in which the chips C1 of the first type are not identical to one another in the stack E has the advantage of forming a single bus in the semiconductor device 1.

In all the embodiments, the portions of the chips that dissipate little heat are used, at least in part, as the stacking surface. The parts of the chips generating a large amount of heat are projecting in the stack and are therefore exposed to the cooling fluid in an optimal manner.

Of course, the invention is not limited to the embodiments described and variant embodiments can be added thereto without departing from the scope of the invention as defined by the claims.

It is in particular possible to mix the two variants of the embodiment and to propose chips of the first type having a first group of vias arranged on the chip according to a predetermined orientation of the chip in the stack, and groups of additional vias placed at a fixed angular pitch on the contour of a circle centered on the stacking surface. A plurality of buses are thus formed in the device, which buses may or may not have identical signals.

The features of the chips C1 of the first type presented in the second embodiment, and in particular the arrangement of the vias on these chips, can also be applied to the chips C of the second type. It is therefore possible to form a heterogeneous stack of chips of the first and second types, as has been presented in the first embodiment, all the chips C, C1 of this stack taking up an arrangement of vias according to the examples set out in the second embodiment.

It will be understood that the preceding examples compatible with 4 chip orientations (0°, 90°, 180° and 270°) can be simplified when a more limited number of orientations is supported. The stacking surface may be rectangular (instead of square), when only two orientations (for example 0° and 180°) are used.

The invention claimed is:

1. A semiconductor device comprising a stack of chips arranged in successive levels along a stacking direction, wherein:

each of the chips extends in a main plane perpendicular to the stacking direction and comprises:

a first portion extending in the main plane;

a second portion extending in the main plane; and a stacking surface extending over only the second portion;

the first portion of each of the chips is configured to release more heat during operation than the second portion;

the stacking surface is in mechanical contact with a chip in an adjacent level of the stack;

the first portion of each of the chips comprises a projecting part configured to be exposed to a cooling fluid; and the second portion of each of the chips of the stack comprises:

a plurality of groups of feed-through vias connected to the first portion and to the second portion and arranged on a first circle; and a plurality of groups of logic signal through vias arranged along a second circle having a same center as the first circle, wherein:

one group of the plurality of groups of logic signal through vias is electrically connected to a first circuit and to a second circuit different from the first circuit; and other groups of the plurality of groups of logic signal through vias are electrically connected to neither of the first circuit and the second circuit.

2. The semiconductor device of claim 1, comprising an interconnection substrate, the interconnection substrate having a first face on which the stack is arranged and a second face, opposite the first, provided with connection pins.

3. The semiconductor device of claim 1, wherein:

the chips of the stack are provided with through vias;

the through vias of a chip are in electrical contact with the through vias of the chips arranged in adjacent levels; and the stack of through vias comprises electrical lines of a bus.

4. The semiconductor device of claim 3, wherein the stack comprises a buffer chip comprising buffer circuits respectively associated with the electrical lines of the bus.

5. The semiconductor device of claim 1, wherein the stack is arranged in a housing of a protective element.

6. The semiconductor device of claim 1, wherein a level of the stack comprises at least two chips.

7. The semiconductor device of claim 1, wherein:

each of the chips comprises an active face and a passive face opposite the active face; and two of the chips arranged in adjacent levels of the stack are assembled with their passive faces against each other or with their active faces against each other.

8. The semiconductor device of claim 1, wherein the first portion of each of the chips comprises the first circuit and the second portion of each of the chips comprises the second circuit.

9. The semiconductor device of claim 8, wherein the first circuit is a processor and the second circuit is a memory array.

10. The semiconductor device of claim 1, wherein two of the chips arranged in adjacent levels of the stack are angularly offset by an angle of one of 90°, 180° and 270°.

11. A semiconductor chip extending in a main plane, the semiconductor chip comprising:

a first portion extending in the main plane and comprising a first circuit; and a second portion extending in the main plane and comprising a second circuit, wherein:

the first portion is configured to release more heat than the second portion when the semiconductor chip is operating; and the second portion also comprises:

a plurality of groups of feed-through vias connected to the first circuit and the second circuit and arranged on a first circle;

a plurality of groups of logic signal through vias arranged along a second circle having a same center as the first circle;

wherein:

one group of the plurality of groups of logic signal through vias is connected to the first circuit and to the second circuit; and other groups of the plurality of groups of logic signal through vias are connected to neither of the first circuit and the second circuit.

12. The semiconductor chip of claim 11, wherein the first circle and the second circle have different radii.

13. The semiconductor chip of claim 11, wherein the first circuit is a processor and the second circuit is a memory array.

14. The semiconductor chip of claim 11, comprising at least one temperature sensor.

* * * * *